United States Patent [19]
Egami

[11] Patent Number: 5,357,189
[45] Date of Patent: Oct. 18, 1994

[54] ANALOG INPUT APPARATUS
[75] Inventor: Noritaka Egami, Nagasaki, Japan
[73] Assignee: Mitsubishi Denki Kabushiki Kaisha, Tokyo, Japan
[21] Appl. No.: 957,032
[22] Filed: Oct. 6, 1992
[30] Foreign Application Priority Data Oct. 7, 1991 [JP] Japan .................................. 3-285454
Apr. 13, 1992 [JP] Japan .................................. 4-118541

[51] Int. Cl.$^5$ ........................... G01R 1/02; G01B 7/18
[52] U.S. Cl. ................................ 324/130; 73/765;
324/706; 364/571.05
[58] Field of Search ............ 324/130, 706, 132;
73/765, 766; 330/9; 364/571.01, 571.02, 571.05

[56] References Cited
U.S. PATENT DOCUMENTS 2,877,308 3/1959 Reiner et al. ............................ 330/9
4,404,856 9/1983 Honda et al. ............................ 73/765
4,535,278 8/1985 Milkovic ................................. 324/130

FOREIGN PATENT DOCUMENTS 58-59218 4/1983 Japan .
63-35309 3/1988 Japan .

Primary Examiner—Ernest F. Karlsen
Attorney, Agent, or Firm—Burns, Doane, Swecker & Mathis

[57] ABSTRACT

An analog input apparatus comprises bridge measuring devices 11 and 31 connected to a bipolar voltage power supply 5, analog multiplexers 18, 19, 38, and 39 responsive to an output level of an oscillator 4B for switching a polarity and outputting two outputs of each of the bridge measuring devices 11 and 31, amplifiers 12 and 32 for amplifying bipolar outputs provided through the analog multiplexers 18, 19, 38, and 39, and an analog-to-digital converter 2 for converting outputs of the amplifiers 12 and 32 into digital form and outputting the resultant digital values. An analog input method comprises the steps of correcting a measured value with the digital value output when voltage at either middle point of a bridge circuit is fed into both input terminals of a differential analog amplifier or feeding two middle-point voltages of a bridge circuit into input terminal of an analog amplifier in order and providing a measured value based on the difference between the digital values output from the analog amplifier.

1 Claim, 9 Drawing Sheets

ANALOG INPUT APPARATUS

BACKGROUND OF THE INVENTION

1. Field of the Invention

This invention relates to an analog input apparatus which enables minute analog signals obtained from a strain gage, etc., to be read as digital values.

2. Description of the Prior Art

FIG. 1 is a block diagram showing a conventional analog input apparatus shown in Japanese Utility Model Laid-Open No. Sho 58-59218 as an example, wherein numeral 1 is a microprocessor which contains a memory, etc., and reads digital values of an analog-to-digital converter (described below) for data processing; numeral 2 is an analog-to-digital converter which converts a voltage value selected by means of a multiplexer into digital form; numeral 3 is an analog multiplexer for selecting one out of several analog input points; numeral 4A is an oscillator with a duty ratio of 1:1; numeral 5 is a constant-voltage regulated power supply as a bipolar voltage power supply for generating bipolar voltage; numerals 6 and 7 are switches such as mercury contact relays; numerals 11 and 31 are strain gages as bridge measuring devices for measuring distortion caused by external force; numerals 12 and 32 are high input impedance differential amplifiers (hereinafter simply referred to as amplifiers); numerals 13 and 33 are forward amplifiers; numerals 14 and 16 and 15 and 17 are resistors and capacitors respectively making up a low-pass filter; and numerals 34 and 36 and 35 and 37 are resistors and capacitors respectively making up a low-pass filter.

Referring now to the timing chart shown in FIG. 2, operation is described. When the low-to-high transition of an output of the oscillator 4A is made, a contacts of the switches 6 and 7 are turned on, applying $+E_0(V)$ to the strain gage 11. At the time, assuming that voltages which are minute analog values appearing due to strain gage distortion are $v_2$ and $v_1$, distortion containing an offset is $\epsilon$, and output voltages of the amplifier 12 and forward amplifier 13 are $v_+$ and $V_+$, the difference between voltages $v_2$ and $v_1$ is as follows:

$$v_2 - v_1 = E_0 \cdot (K\epsilon/4) \qquad (1)$$

wherein $\epsilon$ is distortion obtained from the strain gage and $K$ is a constant determined by the strain gage.

Therefore, the output of the amplifier 12 is as follows:

$$v_+ = g_1(v_2 - v_1) + \alpha(v_2 + v_1) + \beta_1 \qquad (2)$$

wherein $g_1$ is the gain of the differential amplifier, in which case the gain is set to about several hundred times higher because the voltages $v_1$ and $v_2$ are minute voltages in mV units, $\alpha$ is the amplification factor for common mode potential which is ideally zero, but actually has a slight value, and $\beta_1$ is the offset of the differential amplifier.

With the voltage $v_+$ as input the following output voltage $V_+$ is obtained at the forward amplifier 13:

$$V_+ = g_2 v_+ + \beta_2 = g_2 g_1 (v_2 - v_1) + g_2 \\ \alpha(v_2 + v_1) + g_2 \beta_1 + \beta_2 \qquad (3)$$

wherein $g_2$ and $\beta_2$ are the gain and offset of the forward amplifier 13 respectively.

Next, when the high-to-low transition of the output of the oscillator 4A is made, b contacts of the switches 6 and 7 are turned on, applying $-E_0(V)$ to the strain gage 11. At the time, assuming that voltages appearing due to strain gage distortion are $\bar{v}_2$ and $\bar{v}_1$ and output voltage of the forward amplifier 13 is $V_-$, the difference between voltages $\bar{v}_2$ and $\bar{v}_1$ is as follows:

$$\bar{v}_1 - \bar{v}_2 = E_0 \cdot (K\epsilon/4) \qquad (4)$$

Therefore, the output voltage of the forward amplifier 13 is as follows:

$$V_- = g_2 g_1 (\bar{v}_1 - \bar{v}_2) + g_2 \, \alpha(\bar{v}_2 + \bar{v}_1) + g_2 \beta_1 + \beta_2 \qquad (5)$$

Consequently, from the expressions (1), (4), (3), and (5) the difference between voltages $V_+$ and $V_-$ is as follows:

$$V_+ - V_- = 2 g_2 g_1 (v_2 - v_1) + g_2 \, \alpha[(\bar{v}_2 + \bar{v}_1) \\ - (v_2 + v_1)] \qquad (6)$$

Since the second term of expression (6) is near 0, the following is established:

$$|g_2 \, \alpha[(v_2 + v_1) - (\bar{v}_2 + \bar{v}_1)]| \phi 2 \, g_2 \, g_1 \, (v_2 - v_1) \qquad (7)$$

Therefore, the offset constituent is removed and distortion $\epsilon$ can be measured from expressions (1) and (6). An error of the strain gage 11 itself is corrected by the microprocessor from measurement data of the gage. The voltage $E_0$ of the constant-voltage regulated power supply 5 and the gains $g_1$ and $g_2$ are hard to change as compared with the offset. The circuit related to the strain gage 11 is described above; the same also applies to the circuit related to the strain gage 31.

FIG. 3 is a block diagram illustrating a former analog input method, wherein numerals 11-31 are strain gages where the resistance value of one of the arms (for example, $R_1$) changes with the magnitude of distortion caused by external force, and make up a bridge circuit; numeral 5 is a constant-voltage regulated power supply for applying predetermined supply voltages $V_1$ and $V_2$ to the strain gates 11-31; numerals 12-32 are high input impedance differential amplifiers which differentially amplify voltages $v_1$ and $v_2$ obtained from two middle points of each of the strain gages 11-31; numeral 3 is a multiplexer for selectively reading one among voltage values v differentially amplified and output by the differential amplifiers 12-32; and numeral 2 is an analog-to-digital converter which converts the analog voltage value v selected at the multiplexer 3 into digital form.

Next, operation is described. When predetermined supply voltages $V_1$ and $V_2$ are applied to the strain gages 11-31 from the constant-voltage regulated power supply, the voltages $v_1$ and $v_2$ corresponding to the ratio of resistance values of arms $R_1$-$R_4$ are obtained from the two middle points of each of the strain gages 11-31. The relationship between the middle-point voltages $v_1$ and $v_2$ and the supply voltages $V_1$ and $V_2$ is given from the above-mentioned expression (1) by replacing $E_0$ of the expression with $(V_2-V_1)$.

The output voltage values v of the differential amplifiers 12-32, thus amplified, are fed into the multiplexer 3 which then selects one among the voltage values and sends it to the analog-to-digital converter. The selected analog voltage value v is converted into digital form by the analog-to-digital converter 2.

Former analog input apparatus are configured as described above. Thus, when the operating temperature range exceeds 100° C. like 0°-125°, when the offset of the amplifier 12 at the first stage changes 1 millivolt or more in terms of gain 1, distortion is small, and it is necessary to raise the gain 1000 times higher, if, for example, the voltage generated due to distortion is made a maximum of 1 millivolt, the gain of the amplifier 12 at the first stage is multiplied by 70, and the gain of the forward amplifier 13 at the second stage is multiplied by 70, the value of $g_2\beta_1$ in expression (3) becomes no less than "1 millivolt of offset voltage in terms of gain $1 \times 70 \times 70 = 4.9$ volts."

Thus, normally the signal also becomes 1 millivolt x $70 \times 70$ and reaches no less than 9.8 volts in total. If the input range of the analog-to-digital converter 2 is $\phi \pm 5$ volts, that value exceeds this input range. This means that the offset is too large and the gains of the amplifier 12 and forward amplifier 13 cannot be raised. That is, in this case, problems arise such that the gains must be halved, affecting the measurement precision.

When the switches 6 and 7 switch, because of affection of the above-mentioned low-pass filter, rise and fall of output of the forward amplifier 13 become slow and the on/off time of the switches 6 and 7 is slow, thus the read time of analog input becomes slow and the strain gage state also changes, thus problems arise such that when a large number of analog inputs are attempted to be read, it is inevitable to prolong the time because of time constant limits although it should be shorter.

Furthermore, if voltage supplied to the constant-voltage regulated power supply 5 is switching power supplies, output of the power supply 5 also carries spike noise and the above-mentioned resistors 14 and 16 and capacitors 15 and 17 making up the low-pass filter become necessary to remove the spike noise. If the low-pass filter is taken out, precision is adversely affected.

As is obvious from expression (6), it becomes difficult to remove the common mode constituent, and if the common mode gain of the amplifier 12 cannot be made small, precision is adversely affected.

Furthermore, even if the amplifier is adjusted, at room temperature, to set offset $\beta$ to substantially "0", the amplifier gain g is large, thus even a slight change in the offset voltage causes large affection to occur. Particularly, if the operating temperature range is wide, the fluctuation value with the temperature change is difficult to estimate and measurement precision is adversely affected. If temperatures affect the supply voltages $V_1$ and $V_2$ output from the constant-voltage regulated power supply 5, as is obvious from expression (1), it is inevitable to affect measurement precision. The supply voltages applied to the strain gages, $V_1$ and $V_2$, are made the same positive and negative voltages and the resistance values are set to substantially the same to make the common mode voltage $(v_2 + v_1)$ substantially "0", thereby ignoring the term $\alpha(v_2 + v_1)$ of expression (2). However, this measure requires that such setting must be made that the common mode voltage $(v_2 + v_1)$ becomes "0".

SUMMARY OF THE INVENTION

Accordingly, to solve the problems mentioned above, it is an object of the invention to provide an analog input apparatus which can sufficiently raise gains over a wide range of operating temperatures, enables high measurement of distortion, etc., which is made hard to be affected by a temperature change, and enables high speed sampling without causing a switching delay, etc.

It is another object of the invention to provide an analog input apparatus which can effectively remove offsets of differential amplifiers, etc., and sufficiently quicken the switching time of analog multiplexers.

It is still another object of the invention to provide an analog input apparatus which can suppress fluctuations of supply voltages, gains, etc., caused by temperatures.

It is a further object of the invention to provide an analog input apparatus which can remove offsets of differential amplifiers, etc., sufficiently quicken the switching time of analog multiplexers, and suppress fluctuations of supply voltages, gains, etc., caused by temperatures.

It is a still further object of the invention to provide an analog input apparatus which can suppress fluctuations of supply voltages, gains, etc., caused by temperatures and can be intended for improvement of measurement precision by correction phase execution and for collecting temperature data at high speed.

It is a still further object of the invention to provide an analog input apparatus which can be intended for removing offsets of differential amplifiers, etc., for quickening the switching time of analog multiplexers, for improvement of measurement precision by correction phase execution, and for collecting temperature data at high speed.

Also, it is another object of the invention to provide an analog input method which is hard to be affected by temperature changes.

According to a first aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, an amplifier for amplifying bipolar output provided through the analog multiplexers, and an analog-to-digital converter for converting output of the amplifier into digital form and outputting the resultant digital value.

The analog multiplexers are responsive to the high or low level of oscillator output for the polarity of amplifier input, thereby suppressing former differential amplifier offset, improving the measurement precision of distortion because of a gain rise, and reading (sampling) analog input at high speed.

According to a second aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, an amplifier for amplifying bipolar output provided through the analog multiplexers, a differentiation circuit for differentiating output of the amplifier, and an analog-to-digital converter for converting output of the differentiation circuit into digital form and outputting the resultant digital value.

The differentiation circuit removes offsets in differential amplifiers, etc., and sufficiently quickens the switching time of the output analog multiplexer.

According to a third aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, calibration resistors connected between the bipolar voltage power supply and the analog multiplexers, an amplifier for amplifying bipolar output provided through the analog multiplexers, and an analog-to-digital converter for converting output of the amplifier into digital form and outputting the resultant digital value.

The calibration resistors enable suppression of fluctuations of supply voltage, gains, etc., caused by temperatures.

According to a fourth aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, calibration resistors connected between the bipolar voltage power supply and the analog multiplexers, an amplifier for amplifying bipolar output provided through the analog multiplexers, a differentiation circuit for differentiating output of the amplifier; and an analog-to-digital converter for converting output of the differentiation circuit into digital form and outputting the resultant digital value.

The differentiation circuit removes offsets in differential amplifiers, etc., and quickens the switching time of the output analog multiplexer; the calibration resistors enable suppression of fluctuations of supply voltage, gains, etc., caused by temperatures.

According to a fifth aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, calibration resistors connected between the bipolar voltage power supply and the analog multiplexers, an amplifier for amplifying bipolar output provided through the analog multiplexers, a temperature sensor for detecting a temperature and enabling a correction phase to be executed by means of the calibration resistors when a setup temperature changes, and an analog-to-digital converter for converting output of the amplifier into digital form and outputting the resultant digital value.

The temperature sensor is intended to collect temperature data at high speed and to improve the measurement precision by correction phase execution; the calibration resistors enable suppression of fluctuations of supply voltage, gains, etc., caused by temperatures.

According to a sixth aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, calibration resistors connected between the bipolar voltage power supply and the analog multiplexers, an amplifier for amplifying bipolar output provided through the analog multiplexers, a differentiation circuit for differentiating output of the amplifier, a temperature sensor for detecting a temperature and enabling a correction phase to be executed by means of the calibration resistors when a setup temperature changes, and an analog-to-digital converter for converting output of the differentiation circuit into digital form and outputting the resultant digital value.

The temperature sensor is intended to collect temperature data at high speed and to improve the measurement precision by correction phase execution, and the differentiation circuit suppresses offsets in differential amplifiers, etc., and is intended to improve the measurement precision of distortion because of a gain rise and to quicken analog input.

According to a seventh aspect of the invention, there is provided an analog input method which comprises the steps of switching voltages at two middle points of a bridge circuit by means of a multiplexer for feeding into two input terminals of a differential analog amplifier, feeding the digital value output when voltages at different middle points of the bridge circuit are fed into both input terminals of the differential analog amplifier into data processing means as a measured value, and feeding the digital value output when voltage at either middle point of the bridge circuit is fed into data processing means as a correction value of the measured value.

The analog input method can extremely suppress temperature change affection on the precision by correcting a measured value with the digital value output when voltage at either middle point of a bridge circuit is fed into both input terminals of a differential analog amplifier. According to an eighth aspect of the invention, there is provided an analog input method which comprises the steps of switching voltages at two middle points of a bridge circuit by means of a multiplexer for feeding into input terminal of an analog amplifier in order and feeding the digital values output from the analog amplifier into data processing means for providing a measured value based on the difference thereof.

The analog input method can extremely suppress temperature change affection on the precision by feeding two middle-point voltages of a bridge circuit into input terminal of an analog amplifier in order and providing a measured value based on the difference between the digital values output from the analog amplifier.

BRIEF DESCRIPTION OF THE DRAWINGS

These and other objects and novel features of the invention will become more fully apparent upon a reading of the following detailed description taken in conjunction with the accompanying drawings; however, the drawings are given for description and do not limit the scope of the invention; in which.

DETAILED DESCRIPTION OF THE PREFERRED EMBODIMENTS

Referring now to the accompanying drawings, there are shown preferred embodiments of the invention.

Embodiment 1

Figure 4:
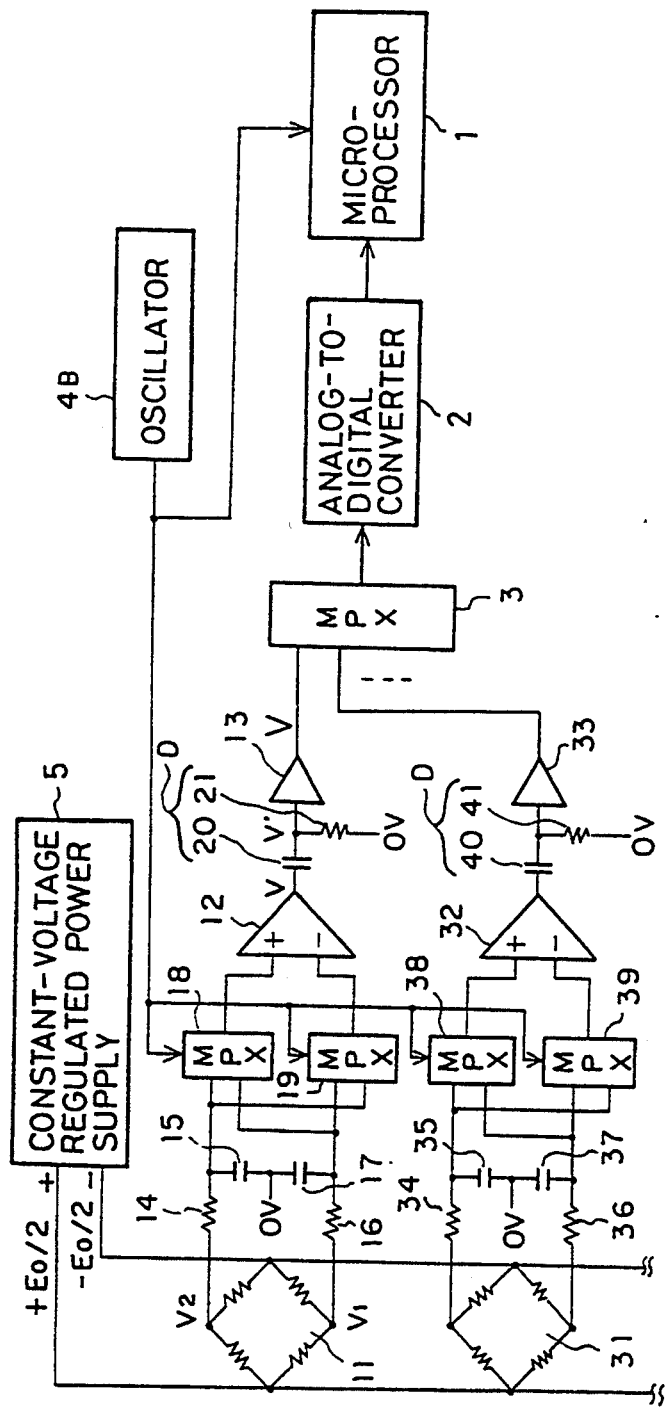
FIG. 4 is a block diagram showing a preferred embodiment of an analog input apparatus according to the invention.

In FIG. 4, numeral 1 is a microprocessor which contains a memory, etc.; numeral 2 is an analog-to-digital converter; numeral 3 is an analog multiplexer for selecting one out of several analog input points; numeral 4B is an oscillator with a duty ratio of 1:1; and numeral 5 is a constant-voltage regulated power supply as a bipolar voltage power supply for generating bipolar voltage.

Numerals 11 and 31 are strain gages as bridge measuring devices for measuring distortion; numerals 12 and 32 are high input impedance differential amplifiers (hereinafter simply referred to as amplifiers); numerals 13 and 33 are forward amplifiers; numerals 14 and 16 and 15 and 17 are resistors and capacitors respectively making up a low-pass filter; and numerals 34 and 36 and 35 and 37 are resistors and capacitors respectively making up a low-pass filter.

Numerals 18, 19 and 38, 39 are analog multiplexers of 2-input type; numerals 20 and 21 are a capacitor and resistor making up a differentiation circuit D connected between an amplifier 12 and a forward amplifier 13; and numerals 40 and 41 are a capacitor and resistor making up a differentiation circuit D connected between an amplifier 32 and a forward amplifier 33.

Figure 1:
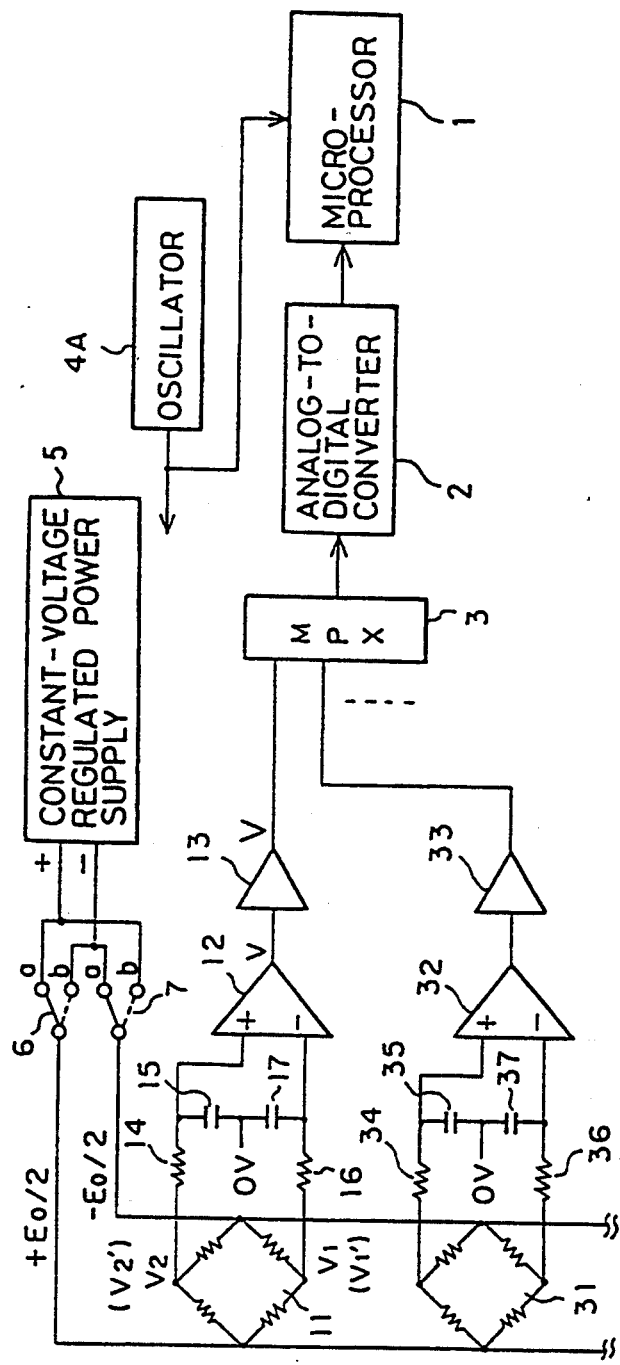
FIG. 1 is a block diagram showing a former analog input apparatus.
Figure 2:
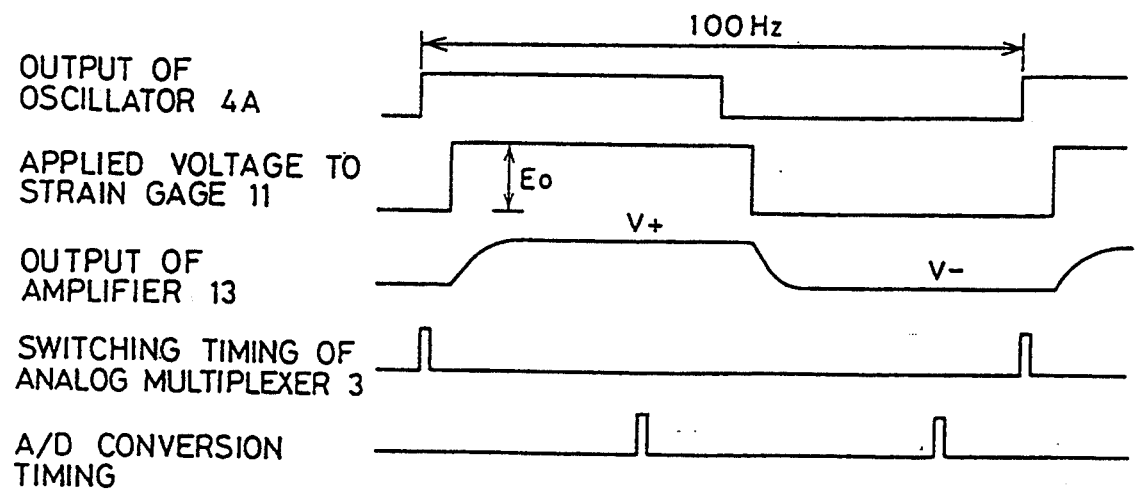
FIG. 2 is a timing chart showing signals at blocks of the circuit shown in FIG. 1.
Figure 5:
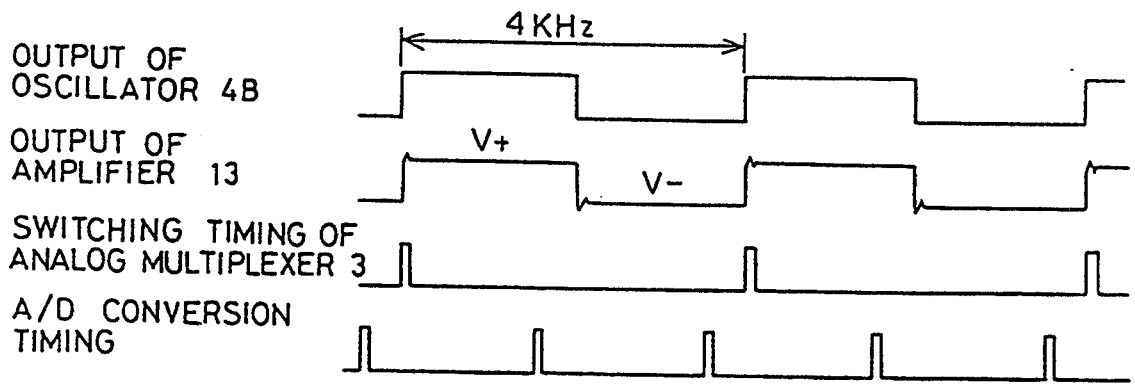
FIG. 5 is a timing chart showing signals at blocks of the circuit shown in FIG. 4.

Referring now to the timing chart shown in FIG. 5, operation is described. When the low-to-high transition of an output of the oscillator 4B is made, the multiplexers 18 and 19 connect the signal from the strain gage 11 to the inputs of the amplifier 12.

At the time, assuming that the minute voltages output by the strain gage 11 are $v_2$ and $v_1$, distortion is, the output voltage of the amplifier 12 is $v_+$, and the input and output of the forward amplifier 13 are $\bar{v}_+$ and $V_+$, the difference between the output voltages $v_2$ and $v_1$, $v_2-v_1$, becomes as in expression (1) mentioned above and the output of the amplifier 12 becomes as in expression (2) mentioned above.

The input $\bar{v}_+$ and output $V_+$ of the forward amplifier 13 become as in the following expressions (8) and (9):

$$\bar{v}_+ = g_1 (v_2 - v_1) \tag{8}$$

$$V_+ = g_2 g_1 (v_2 - v_1) \div \beta_2 \tag{9}$$

Next, when the high-to-low transition of the output of the oscillator 4B is made, the input to the amplifier 12 is inverted and the output voltage $v_-$ of the amplifier 12 and the input $\bar{v}_-$ and output $V_-$ of the forward amplifier 13 become as follows:

$$v_- = g_1 (v_1 - v_2) \div \alpha (v_1 \div v_2) \div \beta_1 \tag{10}$$

$$\bar{v}_- = g_1 (v_1 - v_2) \tag{11}$$

$$V_- = g_2 g_1 (v_1 - v_2) \div \beta_2 \tag{12}$$

Expressions (8) and (11) do not contain $\alpha(v_1-v_2)+$ in expression (2) or (10) because differentiation is made. If the switching time of the analog multiplexer is made sufficiently shorter than the time constant of the differentiation circuit D, voltage decrease at the differentiation circuit D can be ignored on precision. Thus, from expressions (9) and (12), the output difference becomes as shown below and from the expression (13) and expression (1), distortion can be found:

$$V_+ - V_- = 2 g_1 g_2 (v_2 - v_1) \tag{13}$$

Consequently, as obvious from expression (9), only the offset of the forward amplifier 13 at the second stage causes a problem, but is sufficiently small as compared with that of the amplifier 12 at the first stage. That is, even if the operating temperature range is wide, the gains can be raised and the voltage applied to the amplifier 12 depends on the switching speed of the analog multiplexers 18 and 19 and the scan speed can be made high drastically.

As obvious from expression (13), the common mode constituent is removed and precision can be improved. The differentiation circuit D contributes effectively to a raise in the gains in the operating temperature range mentioned above.

Embodiment 2

Figure 6:
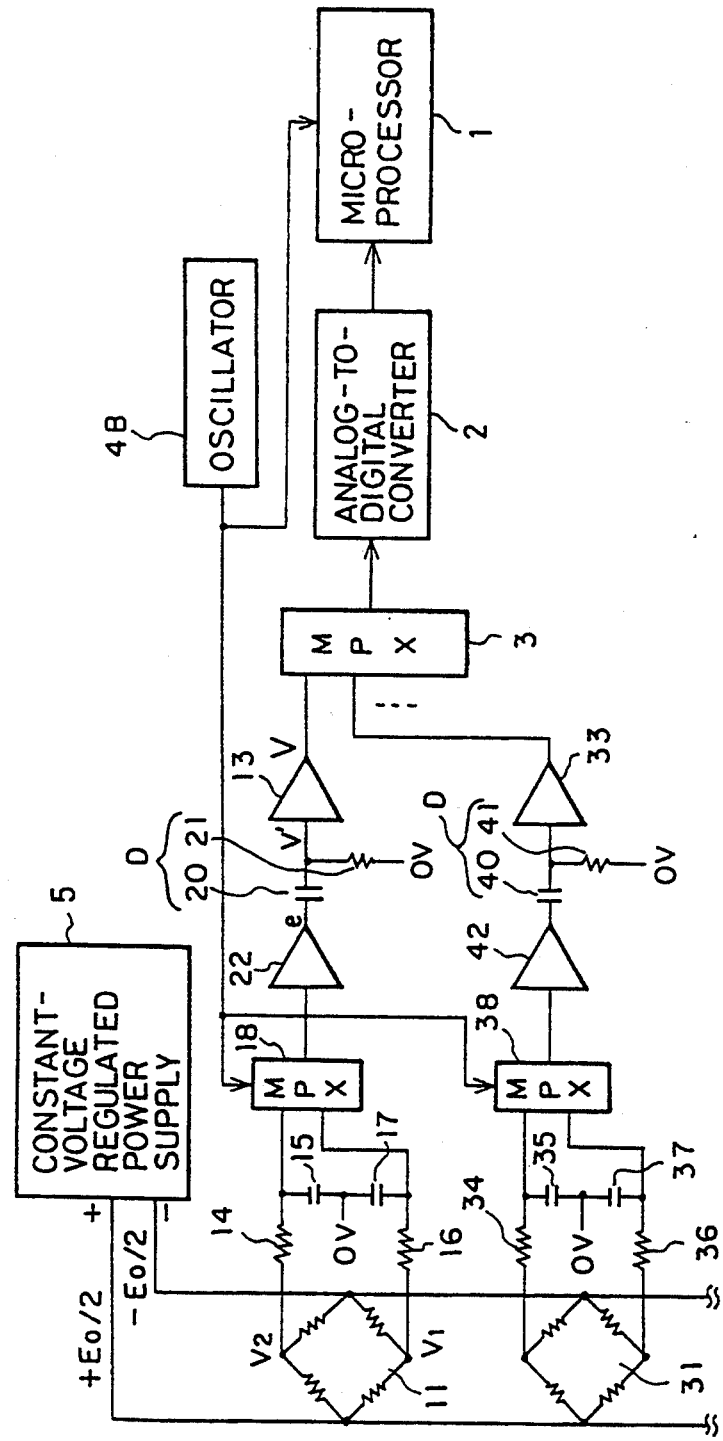
FIG. 6 is a block diagram showing another preferred embodiment of an analog input apparatus according to the invention.

FIG. 6 shows another embodiment of the invention wherein numerals 22 and 42 are forward amplifiers connected to the outputs of the analog multiplexers 18 and 38 respectively, and each gain and offset thereof are $g_1$ and $\beta_1$. Assuming that when an output of the oscillator 4B is high, the output voltage of the forward amplifier 22 is $e_+$ and that when low, the output voltage is $e_-$, the values are as follows:

$$e_+ = g_1 v_2 \div \beta_1 \tag{14}$$

$$e_- = g_1 v_1 \div \beta_1 \tag{15}$$

Assuming that when an output of the oscillator 4B is high, the input voltage of the forward amplifier 13 is $\bar{v}_+$ and that when low the input voltage is $\bar{v}_-$, the values are as follows as the differentiation circuit works:

$$\bar{v}_+ = (\tfrac{1}{2}) g_1 (v_2 - v_1) \tag{16}$$

$$\bar{v}_- = (\tfrac{1}{2}) g_1 (v_1 - v_2) \tag{17}$$

Therefore, assuming that the output voltages of the forward amplifier 13 are $V_+$ and $V_-$, the values are as follows:

$$V_+ = (\tfrac{1}{2}) g_2 g_1 (v_2 - v_1) \div \beta_2 \tag{18}$$

$$V_- = (\tfrac{1}{2}) g_2 g_1 (v_1 - v_2) \div \beta_2 \tag{19}$$

Therefore, the difference between these output voltages, $V_+ - V_-$, is as follows thereby overcoming the former disadvantages:

$$V_+ - V_- = g_2 g_1 (v_2 - v_1) \tag{20}$$

Embodiment 3

Figure 7:
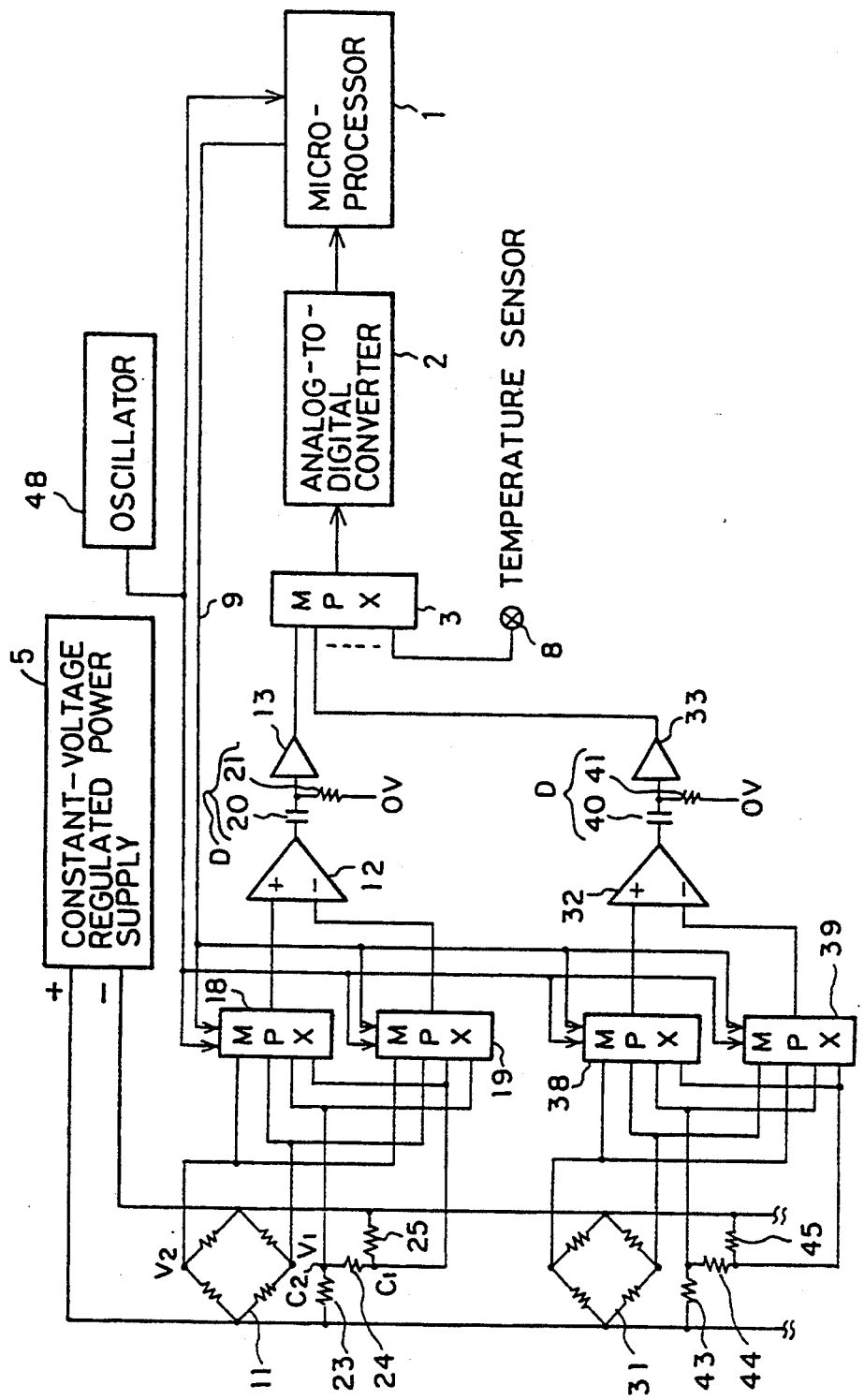
FIG. 7 is a block diagram showing still another preferred embodiment of an analog input apparatus according to the invention.

FIG. 7 shows a further embodiment of the invention wherein numerals 23, 24, and 25, and 43, 44, and 45 are calibration resistors connected between the constant-voltage regulated power supply 5 and the analog multiplexers 18 and 19 and between the power supply 5 and the analog multiplexers 38 and 39. The resistors function so as to cancel affection caused by fluctuations of supply voltages, gains, etc., caused by temperatures. Numeral 8 is a temperature sensor where a low-pass filter is omitted for simplification of the configuration.

Next, operation is explained. When a signal 9 output by a microprocessor 1 is low, a minute signal of a strain gage 11 is input (called a measurement phase). When the signal is high, a calibration voltage by means of the calibration resistors 23–25 is input (called a correction phase).

First, the operation in the measurement phase is the same as that in the above-mentioned embodiment and the output voltage difference is as follows from expressions (1) and (13):

$$V_+ - V_- = 2 g_1 g_2 \cdot E_0 \cdot (K \epsilon/4) \tag{21}$$

Next, when temperature changes greatly, $E_0$ and $g_1 g_2$ also change although not so much as the offset of the forward amplifier 13 changes.

Then, a correction phase appears. The operation in the correction phase is similar to that in the measurement phase. Assuming that the voltages at both ends of the calibration resistor 24 are $C_2$ and $C_1$ and the output voltages of the forward amplifier 13 are $Vt_+$ and $Vt_-$, the potential difference across the calibration resistor 24 is as follows:

$$C_2 - C_1 = E_0 \cdot \bar{\epsilon}_0 \tag{22}$$

The difference between the output voltages of the forward amplifier 13 is as follows:

$$Vt_+ - Vt_- = 2 g_1 g_2 (C_2 - v_1) = 2 g_1 g_2 \cdot E_0 \cdot (K \bar{\epsilon}_0/4) \tag{23}$$

Therefore, the following expression is obtained from expressions (21) and (23):

$$(V_+ - V_-)/(V_+ - V_-) = (K \epsilon/4 \bar{\epsilon}_0) \tag{24}$$

wherein $\bar{\epsilon}_0$ can be obtained as a known value from the calibration resistors 23–25 which are very highly precise over a wide range, and as understood from expression (24), the above-mentioned $E_0$ and $g_1 g_2$ changes can also be corrected. This enables measurement of very high precision.

Embodiment 4

This embodiment uses a temperature sensor for high-speed operation because if measurement and correction phases are repeated alternately to some degree as in Embodiment 3, the sampling period in the measurement phase becomes slow.

Since changes in electric circuit parameters such as $E_0$ and $g_1 g_2$ mentioned above are caused by temperature changes, temperature is measured every low period such as once per second, and for example, if a 10° temperature change occurs, a correction phase is executed only at the time, and the measured value is stored.

When a correction phase was executed previously, if the values before execution of the correction phase are also stored, correction phase execution is not required if the temperature rises and falls repeatedly. If there are a large number of measurement points, the correction phase execution time is prolonged and measurement data during the time are missing, thus eliminating the need for executing correction phases has a great effect on the efficiency.

Embodiment 5

Figure 3:
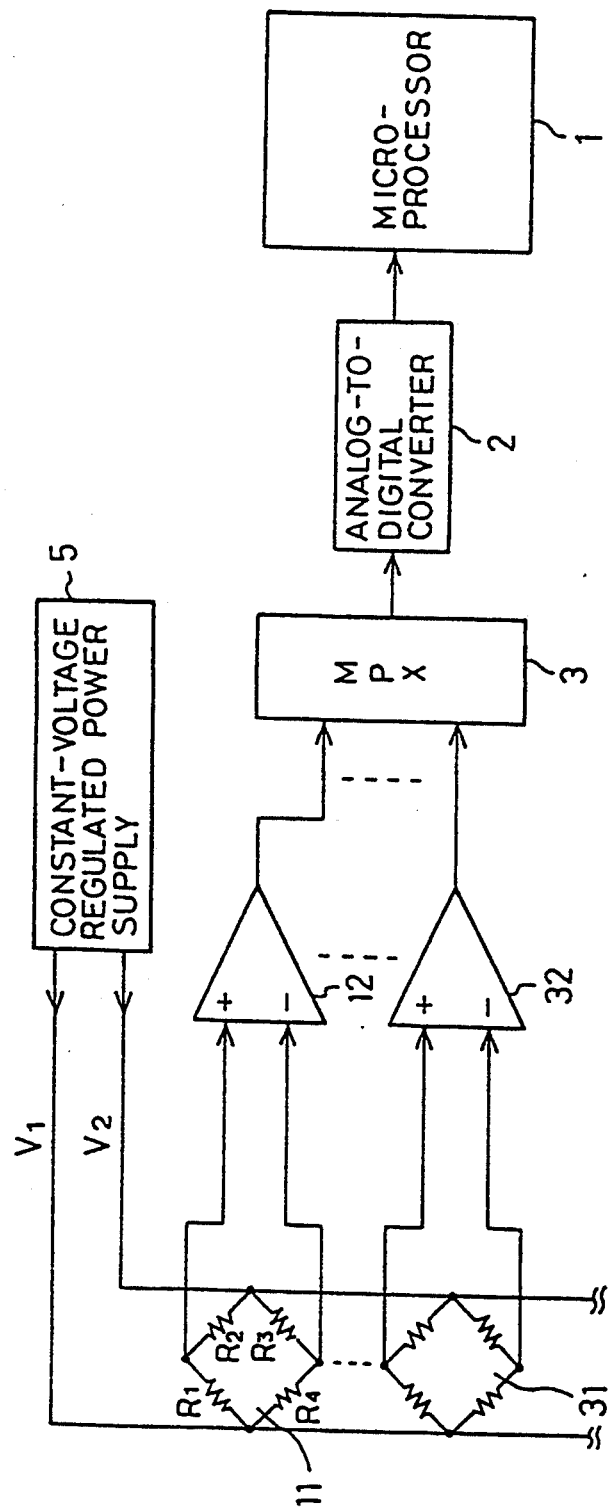
FIG. 3 is a block diagram illustrating a former analog input method.
Figure 8:
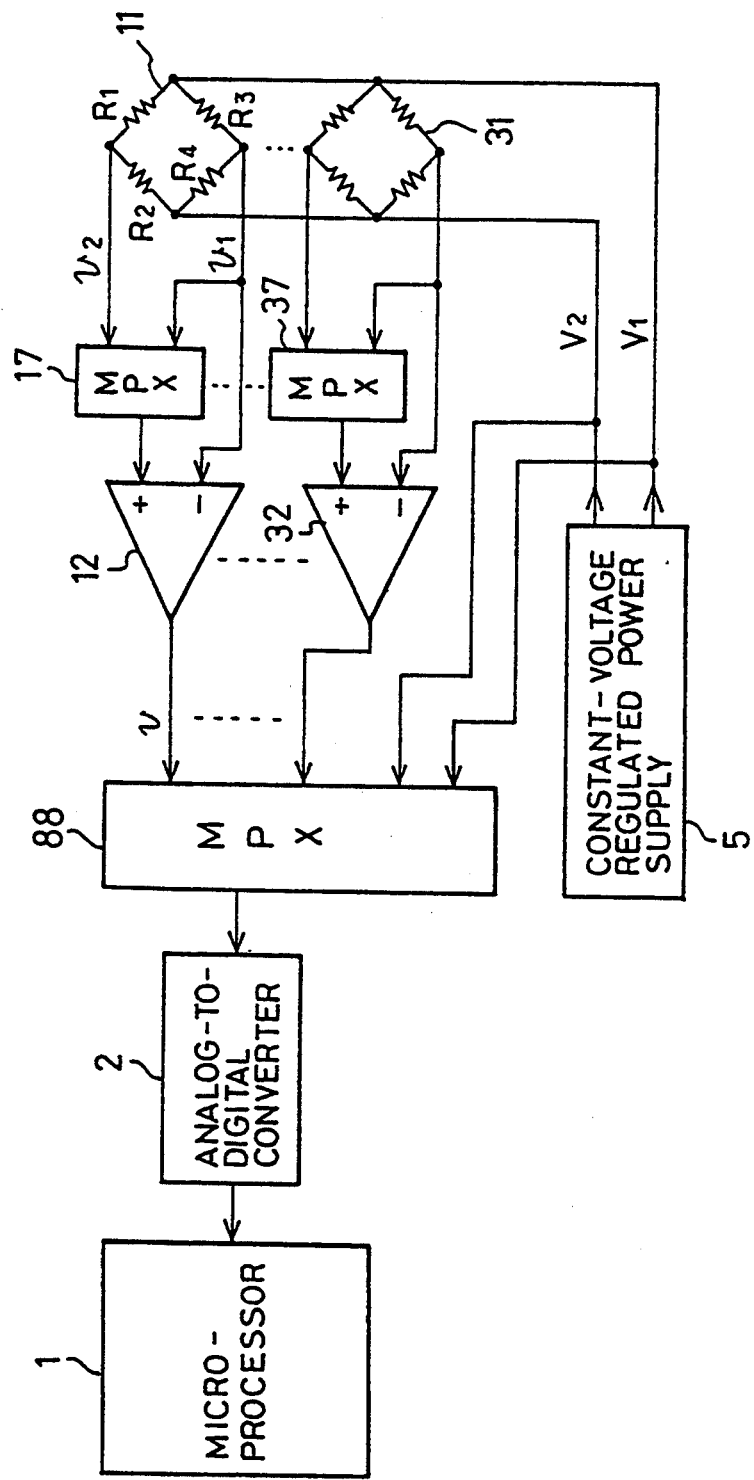
FIG. 8 is a block diagram showing a preferred embodiment of an analog input method according to the invention.

FIG. 8 is a block diagram showing one embodiment of an analog input method of the invention wherein numerals 11–31 are strain gages each having a strain gage at one of its arms; numeral 5 is a constant-voltage regulated power supply; numerals 12–32 are differential amplifiers; numeral 2 is an analog-to-digital converter; and numeral 3 is a microprocessor as data processing means. Since they are the same or corresponding parts of the former analog input method designated by the same reference numerals in FIG. 3, description is omitted.

Numerals 7a–7n are multiplexers, each of which is provided for each of differential amplifiers 12–32 for selectively feeding one of the two middle-point voltages of each of the strain gages 11–31 into one input terminal (+) of each differential amplifier and numeral 88 is a multiplexer different from the former multiplexers in that it can selectively feed not only the output voltage values v of the differential amplifiers 12–32, but also the supply voltages $V_1$ and $V_2$ of the constant-voltage regulated power supply 5 into the analog-to-digital converter 2.

Next, operation is described. If the multiplexer 7a selects the middle-point voltage $v_2$ of the strain gage 11, the voltage value v output by the differential amplifier 12 is obtained according to expressions (1) and (2) as with the former analog input method.

On the other hand, assuming that the output voltage of the differential amplifier 32 obtained if the multiplexer 7a selects the middle-point voltage $v_1$ is $\Delta v$, $\Delta v$ is found from the following expression (30):

$$\Delta v = 2 \alpha \cdot v_1 + \beta \tag{30}$$

If this expression (30) is subtracted from expression (2), expression (31) results. With differential amplifiers, generally gain g is extremely large as compared with amplification factor $\alpha$, thus the expression (31) can be changed into expression (32):

$$-\Delta v = g (v_2 - v_1) + \alpha(v_2 - v_1) \tag{31}$$

$$v - \Delta v = g (v_2 - v_1) \tag{32}$$

Therefore, first the middle-point voltage $v_2$ is selected at the multiplexer 7a and differentially amplified by the differential amplifier 12. Next, the output voltage value v is converted into digital form by the analog-to-digital converter 2 and the digital value is fed into the microprocessor 1. Then, the middle-point voltage $v_1$ is selected at the multiplexer 7a and differentially amplified, and the output voltage value $\Delta v$ is fed into the microprocessor 1 and is subtracted from the digital value of the output voltage v, thereby obtaining the measured value not affected by the offset $\beta$, shown in expression (32).

The common mode voltage affection $\alpha(v_2+v_1)$ in expression (2) can also be ignored and the supply voltages $V_1$ and $V_2$ of the constant-voltage regulated power supply 5 need not be made the same positive and negative voltages, thus one supply voltage, for example, $V_1$ can be set to "0" for reduction of the number of necessary power supplies.

Since the gain g is determined by the internal resistance value of the differential amplifiers 12–32, it is relatively easy to design the apparatus to be hard to be affected by temperatures.

The expressions (1) and (32) are combined into the following expression (33):

$$\frac{k \cdot t}{4} = \frac{1}{z} \cdot \frac{v - \Delta v}{v_2 - v_1} \tag{33}$$

The expression (33) still contains the supply voltages $V_1$ and $V_2$ as parameters easily affected by temperatures. However, the temperature affection can also be easily removed by the multiplexer 88 which selects the supply voltage $V_1$ or $V_2$ and feeds the voltage into the analog-to-digital converter which then converts the voltage into digital form and feeds the digital value into the microprocessor 1 for correction.

The analog-to-digital converter 2 is also affected by temperatures, but not so much as the differential amplifiers 12-32 with high gains are. Even if the analog-to-digital converter 2 is affected by temperatures, the temperature affection on the analog-to-digital converter 2 itself can also be corrected by the multiplexer 88 which selects the supply voltage $V_1$ or $V_2$ and feeds the voltage into the analog-to-digital converter which then converts the voltage into digital form and feeds the digital value into the microprocessor 1 for processing.

Embodiment 6

Figure 9:
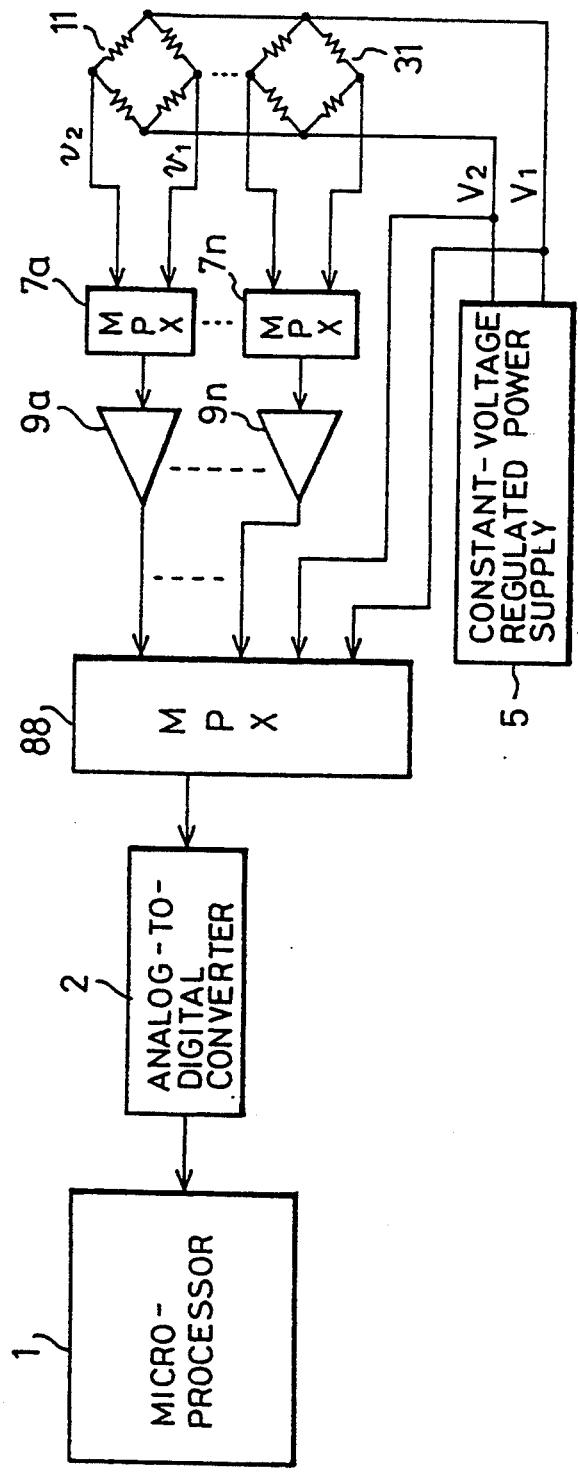
FIG. 9 is a block diagram showing a preferred embodiment of the invention.

FIG. 9 is a block diagram showing another embodiment of the invention wherein parts similar to those previously described with reference to FIG. 8 are denoted by the same reference numerals. In FIG. 9, numerals 9a–9n are normal forward or reverse analog amplifiers with no differential amplification function into which the two middle-point voltages $v_1$ and $v_2$ of the strain gages 11-31 are fed in order by the corresponding multiplexers 7a–7n.

Next, operation is described. Now, assume that the gain and offset of the analog amplifier 9a (-9n) are g and $\beta$. If the middle-point voltage $v_1$ is selected at the multiplexer 7a (-7n) the output voltage value $v_a$ is given according to the following expression (34) and if the voltage $v_2$ is selected, the output voltage value $v_b$ is given according to the following expression (35):

$$v_a = g\, v_2 + \beta \tag{34}$$

$$v_b = g\, v_1 + \beta \tag{35}$$

If the difference between these expressions (34) and (35) is found, the following expression (36) results, indicating that the term of time offset $\beta$ is canceled:

$$v_a - v_b = g\,(v_2 - v_1) \tag{36}$$

Thus, temperature affection can also be reduced by the circuit configuration shown in FIG. 9 according to the expressions (1) and (36). In this case, the following must be noted: To prevent outputs of the analog amplifiers 9a–9n from being saturated, the arms R1–R4 of each of the strain gages 11-31 and the supply voltages $V_1$ and $V_2$ of the constant-voltage regulated power supply 5 are selected properly to set the middle-point voltages $v_1$ and $v_2$ of the strain gages 11-31 to near 0 V.

Such a measure can be easily taken by making the power supply voltages $V_1$ and $V_2$ near equal to each other because time values of time R1–R4 of each of the strain gages are substantially equal to each other.

Embodiment 7

Figure 10:
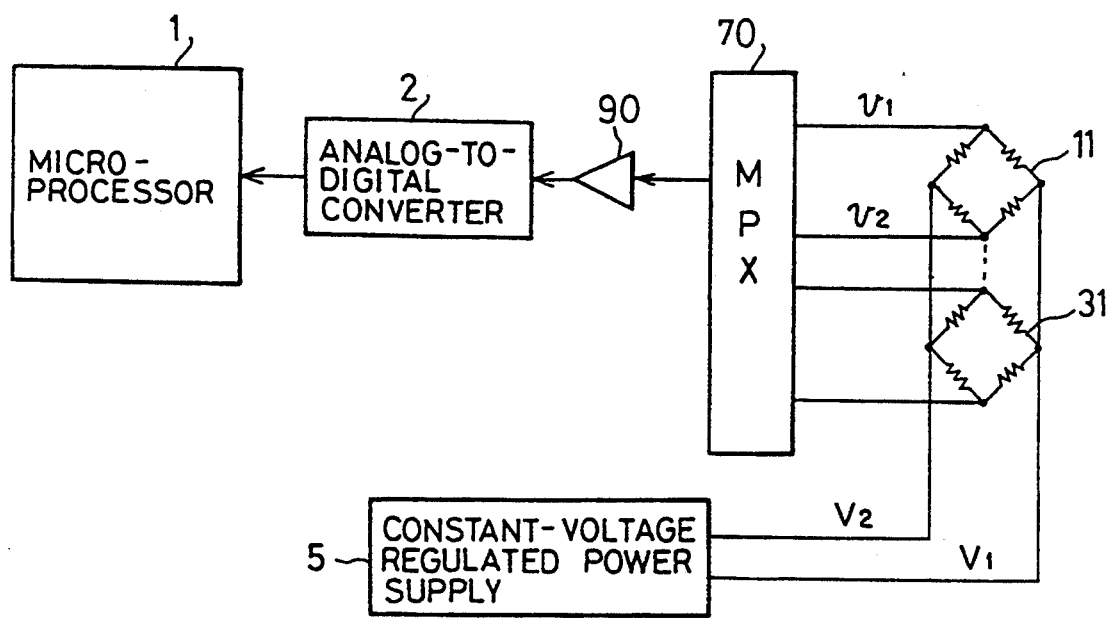
FIG. 10 is a block diagram showing another preferred embodiment of the invention.

Embodiment 6 uses a plurality of analog amplifiers 9a–9n. If the gains thereof can be made the same, as shown in FIG. 10, only one analog amplifier 90 is used and one multiplexer 70 selects either of the two middle-point voltages $v_1$ and $v_2$ of each of strain gages 11-31 and feeds the selected voltage into the analog amplifier 90, thereby reducing time hardware.

Embodiment 8

In embodiments 5-7 described above, strain gages are connected. Other elements such as resistance thermometer elements may also be connected for taking the same effect as in the above-mentioned embodiments.

As described above, according to the first aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, an amplifier for amplifying bipolar output provided through the analog multiplexers, and an analog-to-digital converter for converting output of the amplifier into digital form and outputting the resultant digital value, thus providing the capabilities of sufficiently raising gains for improving the measurement precision of distortion, etc., and of measuring by high speed sampling.

According to the second aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, an amplifier for amplifying bipolar output provided through the analog multiplexers, a differentiation circuit for differentiating output of the amplifier, and an analog-to-digital, converter for converting output of the differentiation circuit into digital form and outputting the resultant digital value, thus providing the capabilities of effectively removing offsets in differential amplifiers, etc., and quickening the switching time of the analog multiplexer.

According to the third aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, calibration resistors connected between the bipolar voltage power supply and the analog multiplexers, an amplifier for amplifying bipolar output provided through the analog multiplexers, and an analog-to-digital converter for converting output of the amplifier into digital form and outputting the resultant digital value, thus providing the capability of suppressing fluctuations of supply voltage, gains, etc., caused by temperatures changes.

According to the fourth aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, calibration resistors connected between the bipolar voltage power supply and the analog multiplexers, an amplifier for amplifying bipolar output provided through the analog multiplexers, a differentiation circuit for differentiating output of the amplifier; and an analog-to-digital converter for converting output of the differentiation circuit into digital form and outputting the resultant digital value, thus providing the capabilities of effectively removing offsets in differential amplifiers, etc., quickening the switching time of the analog multiplexer, and suppressing fluctuations of supply voltage, gains, etc., caused by temperatures changes.

According to the fifth aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, calibration resistors connected between the bipolar voltage power supply and the analog multiplexers, an amplifier for amplifying bipolar output provided through the analog multiplexers, a temperature sensor for detecting a temperature and enabling a correction phase to be executed by means of the calibration resistors when a setup temperature changes, and an analog-to-digital converter for converting output of the amplifier into digital form and outputting the resultant digital value, thus providing the capabilities of suppressing fluctuations of supply voltage, gains, etc., caused by temperatures changes, improving the measurement precision by correction phase execution, and collecting temperature data at high speed. According to the sixth aspect of the invention, there is provided an analog input apparatus which comprises a bridge measuring device connected to a bipolar voltage power supply, analog multiplexers responsive to an output level of an oscillator for switching a polarity and outputting two outputs of the bridge measuring device, calibration resistors connected between the bipolar voltage power supply and the analog multiplexers, an amplifier for amplifying bipolar output provided through the analog multiplexers, a differentiation circuit for differentiating output of the amplifier, a temperature sensor for detecting a temperature and enabling a correction phase to be executed by means of the calibration resistors when a setup temperature changes, and an analog-to-digital converter for converting output of the differentiation circuit into digital form and outputting the resultant digital value, thus providing the capabilities of removing offsets in differential amplifiers, etc., quickening the switching time of the analog multiplexer, improving the measurement precision by correction phase execution, and collecting temperature data at high speed.

According to the seventh aspect of the invention, there is provided an analog input method which comprises the step of correcting a measured value with the digital value output when voltage at either middle point of a bridge circuit is fed into both input terminals of a differential analog amplifier, thus providing the capabilities of effectively eliminating temperature change affection and executing analog input at high precision.

According to the eighth aspect of the invention, there is provided an analog input method which comprises the steps of feeding two middle-point voltages of a bridge circuit into input terminal of an analog amplifier in order and providing a measured value based on the difference between the digital values output from the analog amplifier, thus providing the capabilities of effectively eliminating temperature change affection and executing analog input at high precision.

What is claimed is:

1. An analog input method wherein a resistance value change is converted into a voltage by means of a bridge circuit and said voltage is amplified, then the resultant voltage is converted into a digital value by an analog-to-digital converter and the digital value is fed into data processing means, said analog input method which comprises the steps of:

providing a first multiplexer, a differential analog amplifier, and a second multiplexer;

switching voltages at two middle points of said bridge circuit by means of said first multiplexer for feeding into two input terminals of said differential analog amplifier;

after feeding one middle-point voltage of said bridge circuit into one input terminal of said differential analog amplifier and the other middle-point voltage of said bridge circuit into the other input terminal of said differential analog amplifier, feeding output of said differential analog amplifier through said second multiplexer into said analog-to-digital converter for converting it into digital form;

feeding the resultant digital value into said data processing means as a measured value;

after feeding one middle-point voltage of said bridge circuit into two input terminals of said differential analog amplifier, feeding output of said differential analog amplifier through said second multiplexer into said analog-to-digital converter for converting it into digital form; and feeding the resultant digital value into said data processing means as a correction value of said measured value.

* * * * *